United States Patent [19]

Ball

[11] 4,225,663
[45] Sep. 30, 1980

[54] DRIOGRAPHIC PRINTING PLATE

[75] Inventor: Alan Ball, Woodbury, Minn.

[73] Assignee: Minnesota Mining and Manufacturing Company, St. Paul, Minn.

[21] Appl. No.: 500,385

[22] Filed: Aug. 26, 1974

[51] Int. Cl.² .......................... G03F 7/02; B41N 1/00
[52] U.S. Cl. ................................. 430/303; 101/456; 101/457; 101/465; 430/272
[58] Field of Search ...................... 96/33, 75; 101/450, 101/456, 457, 465; 117/161

[56] References Cited

U.S. PATENT DOCUMENTS

| | | | |
|---|---|---|---|
| 3,163,534 | 12/1964 | Adams et al. | 117/161 |
| 3,179,534 | 4/1965 | Lau | 117/161 |
| 3,209,683 | 10/1965 | Greubel | 101/457 |
| 3,241,486 | 3/1966 | Greubel et al. | 101/457 |
| 3,385,727 | 5/1968 | Thomas et al. | 260/46.5 |
| 3,511,178 | 5/1970 | Curtin | 96/33 |
| 3,677,178 | 7/1972 | Gipe | 101/456 |
| 3,751,257 | 4/1971 | Dahlman | 96/33 |
| 3,859,090 | 1/1975 | Yoerger et al. | 96/1.5 |
| 3,865,588 | 2/1975 | Ohto et al. | 96/33 |
| 3,886,865 | 6/1975 | Ohto et al. | 96/33 |
| 3,890,149 | 6/1975 | Schlesinger et al. | 96/115 P X |
| 3,894,873 | 7/1975 | Kobayashi et al. | 96/33 |
| 3,909,265 | 9/1975 | Miyano et al. | 96/33 |
| 3,910,187 | 10/1975 | Cords | 96/33 X |

Primary Examiner—Edward C. Kimlin
Attorney, Agent, or Firm—Cruzan Alexander; Donald M. Sell; Gerald F. Chernivec

[57] ABSTRACT

A durable planographic driographic printing plate comprising a substrate having a highly abhesive layer thereon which is capable of repelling oleo ink when dry, and photobonded to the abhesive layer in image areas an oleo-ink receptive polymer layer. The photobonding occurs during imaging of the plate by including within the abhesive layer ethylenically unsaturated groups which are copolymerizable with a light-sensitive ethylenically unsaturated free radical initiated photopolymerizable material which provides the ink receptive image areas upon exposure.

12 Claims, 5 Drawing Figures

FIG. 3

DRIOGRAPHIC PRINTING PLATE

BACKGROUND OF THE INVENTION

This invention relates to waterless planographic printing. More particularly it relates to novel photo-sensitive sheet constructions suitable for use in planographic printing wherein conventional fountain solutions are not necessary.

In planographic printing, as the name implies, both image and nonimage areas lie substantially in the same plane, e.g. the ink-receptive image areas are not subtantially raised from the surface of the printing plate. The nonimage or background areas are made ink-repellent so that upon ink application to the plate surface, only image areas accept the ink for subsequent transfer to sheet material.

Conventional lithography, the best known form of planography, generally requires a dampening of the printing plate with an aqueous fountain solution to effectively wet the background plate areas after which ink is rolled over the plate. The oily ink selectively wets the oleophilic image areas but is repelled from the dampened background areas.

To overcome difficulties inherent with conventional lithography, planographic printing plates not requiring dampening have recently been developed. These plates require only an inking system to be operative, and inherently contain ink repellent non-image or background areas. This relatively new concept has come to be known by the term driography, and plates useful therein have been termed driographic plates. Such a printing plate is disclosed in U.S. Pat. No. 3,511,178.

These plates generally operate on the principle that the background surface areas have sufficiently low adhesion to driographic printing inks that ink applied to the plate by an inking roller will not split away or transfer from the roller to the plate in such areas. A surface exhibiting such characteristics has been termed "abhesive".

At present, one technique for providing ink-receptive image areas on driographic printing plates is by selective removal of the abhesive coating. For example, in the aforementioned U.S. Pat. No. 3,511,178 a material which is abhesive, e.g. a curable silicone elastomer, is coated over a light-sensitive diazo resin layer on a suitable substrate. Development of the imaged plate removes the decomposed diazo resin and silicone elastomer overcoat in an imagewise fashion.

Another imaging technique is to overcoat an abhesive material with an ink receptive composition which after imaging can be selectively removed in an imagewise fashion with a developer. In this instance it is extremely difficult to obtain a satisfactory bond between the abhesive layer and the exposed overlayer.

In these prior art concepts it is difficult to obtain a driographic plate having a durable ink receptive image area. This is because the inherent characteristics of the abhesive material provide a surface to which it is difficult to bond an ink receptive layer. This difficulty of attaining a high degree of image adherence generally results in a plate having a substantially limited press life.

It has now been found that image adhesion can be greatly enhanced by providing an abhesive layer which will chemically bond to an overlying ink receptive layer in areas exposed to actinic radiation. This photobonding occurs because the abhesive layer contains therein ethylenically unsaturated groups which are copolymerizable with an overlayer of ethylenically-unsaturated free radical initiated photopolymerizable material. Te photopolymerizable overlayer, upon exposure, provides an oleophilic surface which is photobonded to the underlying abhesive layer upon exposure, thereby providing a durable ink receptive image area and correspondingly a press life superior to prior driographic printing plates.

SUMMARY OF THE INVENTION

In accordance with the invention there is provided a planographic driographic printing plate comprising a substrate having a highly abhesive layer thereon which is capable of repelling oleo ink when dry and having photobonded to the abhesive layer in image areas an oleo-ink receptive polymer layer.

The plate can be provided from a light-sensitive composite construction comprising a substrate with an abhesive layer thereon and having contained within the abhesive layer ethylenically unsaturated groups which are copolymerizable with a light-sensitive ethylenically unsaturated free radical initiated photopolymerizable overlayer. Exposure followed by development removes the unexposed portions of the overlayer, exposed portions being photobonded to the underlying abhesive layer.

Alternatively the photopolymerizable layer can be applied to a separate light-transparent substrate and laminated to the abhesive layer. After exposure through the transparent substrate, this substrate is peeled away whereupon the unexposed portions of the photopolymerizable layer are removed therewith, the exposed polymerized portions being photobonded to the abhesive layer to provide the ink receptive image areas.

In this manner a durable driographic printing plate having a substantially increased press life is provided.

DETAILED DESCRIPTION OF THE INVENTION

Figure 1:
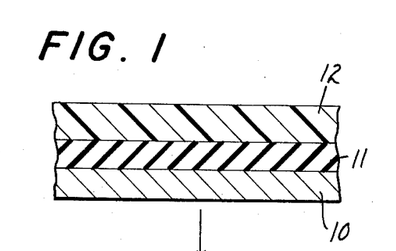
Figure 2:
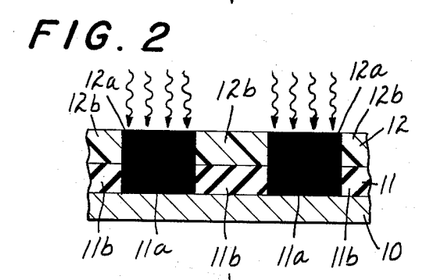
Figure 3:
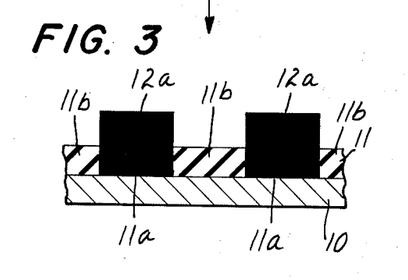

Referring to the drawing, FIGS. 1 through 3 illustrate a cross section of one embodiment of the invention in various stages of processing. In FIG. 1 is shown a substrate 10 having bonded to the surface thereof layer 11, which is a cured abhesive material containing therein ethylenically-unsaturated groups. Light-sensitive overlayer 12 comprises an ethylenically-unsaturated free-radical initiated photopolymerizable compound and an initiator therefor and is coated over layer 11.

In FIG. 2 is shown the composite structure of FIG. 1 Stage A during exposure to actinic radiation through an original. The radiation passing through the more transparent areas of the original causes polymerization of the ethylenically-unsaturated compound of overlayer 12 in areas 12a and copolymerization of at least a portion of this compound with the ethylenically-unsaturated groups contained in layer 11 in areas 11a. Areas 12b are not exposed to actinic radiation and therefore are not polymerized.

In FIG. 3 is shown the structure of FIG. 2 following development of the printing plate with a suitable developer. During development, areas 12b are softened or dissolved and correspondingly removed, thereby revealing areas 11b of layer 11 which are abhesive, i.e. oleo-ink repellent. Areas 12a, being polymerized by the action of radiation and photobonded to the underlying abhesive layer, remain on the plate as the oleophilic or ink receptive areas thereof.

Figure 4:
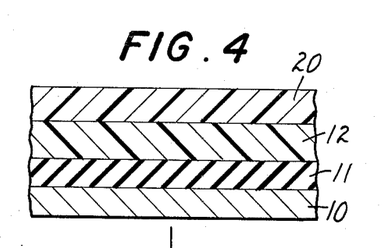
Figure 5:
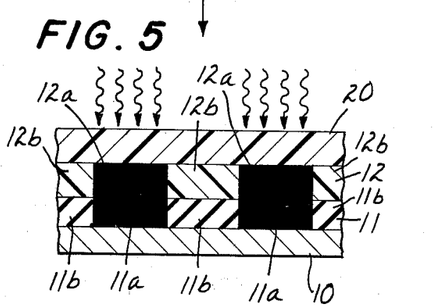

FIGS. 4 and 5 illustrate an alternative method of providing the driographic printing plate of my invention. In FIG. 4 is shown substrate 10 having bonded to the surface thereof layer 11, which is a cured abhesive material containing therein ethylenically unsaturated groups. Substrate 20, which is transparent to actinic radiation, has light-sensitive layer 12 thereon comprising an ethylenically unsaturated free radical initiated photopolymerizable compound and initiator therefor.

As illustrated in FIG. 5, layer 12 on transparent substrate 20 is laminated to layer 11 on substrate 10, whereupon the composite structure is imaged through an original. Substrate 20 is then peeled from the cmposite structure whereupon unexposed areas 12b of layer 12, which preferentially adhere to substrate 20, are also removed, thereby providing the imaged construction shown in FIG. 3. The ink receptive photopolymerized portions 12a of layer 12 are photobonded to areas 11a of abhesive layer 11.

The dimensions of the various stages in the drawings are for illustrative purposes only and do not correspond to the actual dimensions of the composite structure. For example, while the layers illustrated in FIG. 1 are shown as being generally of the same thickness, the support is in fact much thicker than the layers thereon, which are ordinarily less than about 25 microns in thickness. At FIG. 3, a finite depression is shown where areas 12b have been removed. In actuality, the depression left is so slight as not to alter the planar character of the surface.

Since the support or backing 10 does not have to provide a printing surface, a wide variety of substrates are available for use. These include sheets or plates of metals, especially aluminum and stainless steel; paper; primed or umprimed polymeric materials such as polyesters, polystyrene, and polyvinyl chloride; chrome plated steels; and plastic-aluminum laminates. Preferred supports are aluminum or aluminum alloy, paper, and titanium dioxide primed polyester.

Support or backing 20, when utilized, must be transparent to actinic radiation. Exemplary transparent substrates include polymeric sheets such as polyesters, polystyrene, and polyvinyl chloride.

Abhesive materials are those chemical species which, when coated on a suitable substrate, have sufficiently low adhesion for driographic printing inks such that ink will not transfer to them when utilized in conventional lithographic presses with the dampening system removed. Generally, chemical species having low surface free energies function well as abhesive materials. Examples of such species include perfluoroaliphatic compounds and organopolysiloxanes.

The abhesive properties of a surface can be defined in terms of its effectiveness as a release agent. This effectiveness can be conveniently measured by a recognized test, wherein a piece of adhesive tape is applied to the surface and the force required to strip the tape from the surface is measured. The test parameters and details are as disclosed in aforementioned U.S. Pat. No. 3,511,178, such disclosure herein incorporated by reference. As pointed out therein, materials with release values up to about 100 grams per inch generally have utility as abhesive materials, while those having a value in excess of 100 are generally unsatisfactory.

An excellent example of materials having abhesive characteristics are cured organopolysiloxanes. The abhesive organopolysiloxanes useful in my invention are cross-linkable organopolysiloxanes obtained by the catalytic reaction of a mixture of:

(a) a hydroxy-terminated polysiloxane having the structure

Formula I and (b) about 3 to about 10 percent by weight of a hydrogen siloxane having the structure

Formula II wherein the R's are methyl, ethyl or phenyl, w is from about 100 to about 2500 and x and y are each from about 2 to about 15.

It has been found that such organopolysiloxanes can be functionalized so as to contain therein the requisite ethylenically unsaturated polymerizable groups.

One method by which this can be accomplished is by physical occlusion, i.e. intermixing of an ethylenically-unsaturated polymerizable compound with a curable organopolysiloxane. Therefore, from about 0.1 to about 1.0 parts by weight of an ethylenically-unsaturated free-radical initiated polymerizable compound per part of the mixture of (a) and (b) can be added to the curable polysiloxane mixture, wherein upon curing, the unsaturated compound is retained in the crosslinked organopolysiloxane elastomer network by physical occlusion.

The cured organopolysiloxanes in this instance have structural units of

Formula III wherein R, x, y and w are as defined above. Since the ethylenically unsaturated groups are retained by physical occlusion within the cured siloxane network and not by chemical linkage, they are not indicated in the above structure.

Alternatively, and preferrably, the polymerizable ethylenically-unsaturated groups can be chemically linked to the organopolysiloxane during the curing reaction by including with reaction mixture (a) and (b) above, from about 0.01 to about 2.5 parts by weight per part of component (a) of a hydrolyzable acryloyloxysilane having the structure

Formula IV wherein R is as defined above, X is a hydrolyzable group, m is 0, 1 or 2, $(CH_2)_n$ is an alkylene group having n carbon atoms, n is 1 to 4; and Y is hydrogen, methyl, halogen or phenyl.

By the term "hydrolyzable group" as used above is meant a group that reacts readily with active hydrogen such as is present in water under basic, neutral or acidic conditions to provide a hydroxy group. Such hydrolysis can occur under mild conditions such as room temperature. Examples of hydrolyzable groups include methoxy, ethoxy, butoxy, phenoxy; acyloxy groups such as acetoxy, benzoyloxy, propionyloxy; amino groups such as amino, dimethylamino; and halo groups such as chloro and bromo.

The term active hydrogen is well-known and commonly used in the art, and as used herein means active hydrogen as measured and determined by the method described by Zerewitinoff in *J. Am. Chem. Soc.*, Vol. 49, 3181 (1927).

During the catalyzed curing reaction, components (a) and (b) react with subsequent elimination of water. Component (a) and the reaction product of components (a) and (b) further react with component (c) with elimination of HX to form a cured organopolysiloxane having structural units of:

Formula V wherein R, x, y, w, m, n and Y are as defined above.

Exemplary of the hydrolyzable acryloyloxysilanes depicted in Formula IV above are acryloyloxymethyltrichlorosilane, 3-acryloyloxypropyltrimethoxysilane, 3-methacryloyloxypropyltriaminosilane, bis(3-methacryloyloxypropyl)dimethoxysilane and 3-methyacryloyloxypropyltrimethoxysilane.

Hydroxy-terminated polysiloxanes suitable for use in my invention have molecular weights from about 10,000 to about 400,000 or more. Such polysiloxanes are well-known in the art and are obtained by the hydrolytic polymerization of $R_2SiX_2$ compounds wherein R and X are as defined above or by the hydrolytic copolymerization of two or more $R_2SiX_2$ compounds.

Suitable hydrogen siloxanes have a molecular weight from about 150 to about 30,000. The hydrogen siloxanes are prepared by the hydrolytic copolymerization of $RHSiX_2$ compounds and a molecular weight-controlling amount of $R_3SiX$ with or without $R_2SiX_2$ compounds wherein R and X are as defined above. Reference is made to such hydrogen siloxanes in U.S. Pat. Nos. 3,076,726 and 3,518,325.

One exemplary hydroxy-terminated polysiloxane/hydrogen siloxane mixture for preparing the curable abhesive material of layer 11 comprises a mixture of Syloff 23 and Syloff 291, tradenames for hydroxy-terminated polydimethylsiloxanes having molecular weights of 200,000 and 20,000, respectively, with each having therein about 5 to 10 percent by weight of a hydrogen siloxane having a molecular weight of about 1000.

Suitable ctalysts for use in the curing of abhesive layer 11 are essentially those catalysts that are typically used to cure siloxane polymers, and include organometallic compounds such as organotin and organotitanium compounds such as diethyltindiacetate, dibutyltindilaurate, dibutyltindimaleate, tetraethyltitanate and tetrabutyltitanate. Typically from about 0.5 percent to 5 percent and preferably about 2 to 3 percent by weight of catalyst can be utilized based on the weight of the components in abhesive layer 11.

Suitable ethylenically-unsaturated free-radical initiated photopolymerizable compounds for the light-sensitive layer are those conventional nonvolatile ethylenically-unsaturated free-radical initiated addition polymerizable monomers or mixture of monomers. By nonvolatile is meant a compound having a boiling point preferably above about 150° C.

Typical monomers include the acrylates, e.g. methyl acrylate, ethyl acrylate, butyl acrylate, methyl methacrylate, ethyl methacrylate, butyl acrylate, and 2-ethylhexyl acrylate and the corresponding ethyl esters; polyhyric alcohol esters of acrylates, e.g. bis[p(3-acryloyloxy-2-hydroxypropoxy)phenyl]dimethylmethane, bis[p(2-acryloyloxyethoxy)phenyl]dimethylmethane, trishydroxyethylisocyanurate trimethylacrylate, pentaerythritol triacrylate, pentaerythritol tetraacrylate, 2,2-bis(acryloyloxymethyl)propionic acid, trimethylolpropane triacrylate, trimethylolethane diacrylate, glycerol triacrylate, polyethylene glycol diacrylate, triethyleneglycol diacrylate, tripropyleneglycol dimethacrylate, diethyleneglycol diacrylate, hexanediol diacrylate and sorbitol hexacrylate and the corresponding methacrylate esters; vinyl aromatics, e.g. styrene, α-methylstyrene, 1,4-divinyl benzene, 2-vinyl naphthalene; unsaturated amides, e.g. acrylamide, methacrylamide, methylene bismethacrylamide, diethylenetriamine tris-methacrylamide, N-hydroxyethylacrylamide; vinyl esters, e.g., vinyl acetate, vinyl butyrate, vinyl stearate; vinyl pyrrolidone; vinyl carbazole; trishydroxyethylisocyanurate diacrylate; and the like. These aforementioned compounds are also suitable for use in the abhesive layer when ethylenically-unsaturated groups are retained in the abhesive layer by physical occlusion.

Generally, layer 12 contains in addition to the photopolymerizable monomer a film-forming component, a radiation-activated free-radical polymerization initiator and a surface active agent.

Suitable film-forming components for use in layer 12 are thermoplastic polymers that are readily soluble in common solvents which are generally not solvents for cured organopolysiloxanes. Examples of such thermoplastic polymers include acrylic ester polymers and copolymers of acrylic esters with acrylic acids and/or other copolymerizable monomers, e.g. polymethylacrylate, polymethylmethacrylate, and copolymethylmethacrylate/acrylic acid; polyvinyl esters, polyvinylacetate and polyvinyl acetate/methylacrylate; cellulose esters, e.g. cellulose acetate, cellulose acetate/butyrate; cellulose ethers, e.g. methyl cellulose; vinyl chloride copolymers, e.g., vinyl chloride/acetate and vinyl chloride/vinylidene chloride; vinylidene chloride copolymers, e.g. vinylidene chloride/vinylacetate, vinylidene chloride/acrylonitrile, and vinylidene chloride/methylmethacrylate; polyesters, e.g., polybutylenesuccinate and polyethylenephthalate; and polyurethanes.

When a film-forming component is employed in layer 12, the concentration should be such that the composition will form a discrete or integral continuous film which is nontacky to the touch. Generally there can be employed from about 5 to about 50 parts by weight of film-forming component per part by weight of photopolymerizable monomer. Lower concentrations of film-forming components are suitable when a solid or viscous monomer is employed and higher concentrations are more suitable when a more fluid monomer is employed.

Suitable photoinitiator systems comprise the vinyl-substituted halomethyl-s-triazines described in copending application Ser. No. 177,851 filed Sept. 3, 1971, incorporated herein by reference. These photoinitiators induce high crosslinking rates for the photopolymerizable compounds, they are effective at low concentrations, and they do not require the presence of sensitizing dyes.

The photoinitiator is typically used in amounts ranging from about 0.1 percent to about 10 percent by weight, and more preferrably about 1 to about 3 percent by weight based on the total weight of the components of layers 11 and 12.

Surfactants, e.g. fluorocarbons, may be added to the polymerizable overlayer to improve the coating characteristics of this layer onto the cured polysiloxane abhesive layer.

While not wishing to be limited by theory, it is anticipated that the light sensitive layer, upon exposure, is chemically bonded to the abhesive underlayer by reason of two mechanisms. It is believed that when overcoating a cured abhesive layer with the photopolymerizable material, some penetration of the abhesive layer occurs, thereby allowing the copolymerizable ethylenically unsaturated group crosslinkable access to each other. It is also believed that the polymerizable ethylenically unsaturated groups are available at the abhesive surface to thereby allow for interaction and crosslinking at the interface between the abhesive and upper layers.

When necessary, suitable solvents for the development of the exposed plates of the invention are selected on the basis of the solubility of the particular photopolymerizable materials used, i.e. choosing a solvent that will dissolve or disperse the unexposed nonpolymerized overlayer but not dissolve or attack the exposed polymerized overlayer. Generally water miscible organic solvents containing from about zero percent to about 50 percent water by volume are used. However, with some photopolymerizable layers, such as those layers containing water soluble binders, e.g. a polyvinyl alcohol binder, water alone may be used as the developing solvent. Water miscible organic solvents having 3 or more carbon atoms are preferred.

It is within the scope of the invention to include in the abhesive layer other adjuvants to provide some particular characteristic to the layer. Thus, fillers such as clays, titanium dioxide, silica, glass microspheres or bubbles, diatomaceous earth and the like may be added in quantities up to about 20 percent by weight of the total components in the abhesive layer to improve characteristics thereof. It is important, however, that the amount of fillers added is not so great as to appreciably reduce the abhesive character of the layer. Pigments may also be added to provide color to the layer. Adhesion promoters such as vinyltriacetoxysilane and glycidoxypropyltrimethoxysilane or mixtures thereof may be added to the abhesive layer to improve the bonding of the polysiloxane to the substrate, particularly when the substrate is of polymeric nature.

The light sensitive construction of the invention can be simply prepared by the steps of (a) coating a suitable substrate such as a sheet of 5 mil thick aluminum with a solution of the organopolysiloxane material in a suitable organic solvent, such as toluene, xylene, benzene or heptane to provide a dry coating thickness of from about 5 to 50 microns or greater; (b) drying the coating and curing it by heating for 10 to 30 minutes at about 100° to 200° C.; (c) overcoating the cured abhesive layer with a solution of the light sensitive ethylenically-unsaturated polymerizable compound, the photo-sensitizer and an optional binder in a suitable organic solvent; and (d) drying the overcoating. Dry coating thicknesses from about 5 to 25 microns may be employed in the photopolymerizable layer. Thinner layers provide better actinic light penetration, but extremely thin coatings may be sufficiently discontinuous to make imaging difficult.

Alternatively, prior to coating, the solution of the abhesive material in a suitable solvent can be heated to a temperature of 70° to 90° C. for about 1 to 2 hours and allowed to cool in order to effect reaction of the hydroxy-terminated polysiloxane, the hydrogen siloxane and the hydrolyzable acryloyloxysilane. The solution can then be coated and cured in the above-described manner.

Rather than overcoating the abhesive layer, the photopolymerizable material can be coated onto an actinic radiation-transparent backing and dried. The two sheets can be laminated at moderate pressure, sufficient to insure intimate contact therebetween, imaged, and the transparent backing to which the unexposed photosensitive material preferentially adheres, simply peeled away.

The photosensitive construction can be exposed utilizing conventional exposure equipment. For the most efficient operation it is desirable to avoid oxygen inhibition of the photopolymerizable layer. This can be undertaken by utilizing conventional techniques wherein the photosensitive sheet is exposed under vacuum.

Having now generally described the invention, the same will be more specifically described with the aid of the following specific but nonlimiting examples wherein all parts are parts by weight unless otherwise specified.

EXAMPLE 1

A 5 mil aluminum sheet was cleaned of surface oil and coated, using a No. 20 Meyer bar, with a solution of:

| | |
|---|---|
| 10 parts | Syloff 23 (Tradename for a mixture of a hydroxy-terminated polysiloxane having an average molecular weight of 200,000 and containing 5 to 10 percent hydrogen siloxane having an average molecular weight of about |

| | |
|---|---|
| | 1000.) |
| 2.5 parts | Union Carbide A174 (Tradename for 3-methacryloyloxypropyltrimethoxysilane.) |
| 0.18 part | Dibutyltin dilaurate (silicone curing agent.) |
| 0.1 part | Dow Corning A297 (Tradename for a mixture of a triacetoxyvinylsilane and 3-glycidyloxypropyltrimethoxysilane, used as an adhesion promoter.) |
| 50 parts | Xylene |

The coating was air dried and cured by heating at about 90° to 100° C. for 10 minutes, whereupon an abhesive coating having a dry weight of about 6.0 grams per square meter was obtained. The silicone coating was then overcoated with a solution of:

| | |
|---|---|
| 5.0 parts | Elvacite 2013 (Tradename for an acrylate polymer.) |
| 2.8 parts | Trimethylolpropane trimethacrylate (designated hereinafter as TMP-TMA). |
| 0.15 part | 6-(4'methoxystyryl)-2,4-bis(trichloromethyl)-s-triazine, a photoinitiator (hereinafter designated as MOST). |
| 0.1 part | FC-431 (Tradename for a fluorocarbon surfactant). |
| 40 parts | Toluene |

After drying, the plate was exposed in a vacuum frame through a negative for 45 seconds to a mercury arc lamp exposure unit. The exposed plate was developed with isopropanol, whereupon unexposed areas of the photosensitive overlayer were removed, dried and placed in an offset printing press using driographic ink with the press dampening system inactivated. On starting the press, ink transferred from the ink rollers to the exposed areas of the plate but not to the unexposed areas. More than 2000 sharp impressions having a clear background were obtained.

EXAMPLE 2

Printing plates were prepared as described in Example 1 by first coating an aluminum sheet with a solution of:

| | |
|---|---|
| 10 parts | Syloff 23 |
| 10 parts | Union Carbide A 174 |
| 0.36 part | Dibutyltin dilaurate |
| 0.2 part | Dow Corning A 297 |
| 50 parts | Xylene | followed by curing. The coating was then overcoated with a solution of:

| | |
|---|---|
| 10 parts | Elvacite 2013 |
| 5.6 parts | TMP-TMA |
| 1.8 parts | Trimethacrylate ester of trihydroxyethylisocyanurate |
| 0.3 part | MOST |
| 0.05 part | FC-431 |
| 70 parts | Xylene |

After drying, the plates were exposed to an ultraviolet pattern and separately developed with isopropanol containing up to about 50 percent water, butyl cellosolve, isopropanol containing 33 percent butyl cellosolve, t-butanol and dibutyl ether.

Excellent printing plates giving more than 2000 impressions from an offset press with an inactivated dampening system were obtained from the developed plates.

Less suitable developers, in that some attack occurred on the polymerized photobonded resin overlayer, are diethyl ether, methanol, methoxyethanol and butyl butyrate. A preferred developer for this plate construction is a mixture of 70 percent t-butanol, 28 percent water, and 2 percent butyl ether by volume.

EXAMPLE 3

Printing plates were prepared as described in Example 1 by first coating an aluminum sheet with a solution having the same composition as used for the abhesive coating of Example 2, curing the coating, and overcoating with a solution of:

| | |
|---|---|
| 7.5 parts | Elvacite 2013 |
| 3 parts | TMP-TMA |
| 3 parts | Trimethacrylate ester of trihydroxyethylisoxyanurate |
| 0.3 part | MOST |
| 0.5 part | FC-431 |
| 1.0 part | Aroclor (Tradename for a polychlorinated biphenyl resin) |
| 0.5 part | Titanium dioxide |
| 70 parts | Xylene |

After drying, the plate was exposed in a vacuum frame through a negative for 45 seconds to a mercury arc lamp exposure unit and the exposed plate developed with a mixture consisting of 70 percent t-butanol, 8 percent water and 2 percent butyl ether by volume. After drying, the plate accepted oleo-ink in exposed areas but not in unexposed areas. Impressions having a clear background were obtained.

EXAMPLE 4

Printing plates were prepared as described in Example 2 with the exception that 1.0, 2.0, 4.0 and 8.0 parts of TMP-TMA were substituted for the Union Carbide A174 in the abhesive layer in separate experiments. This provided for an acrylate monomer which was retained in the abhesive layer by occlusion as opposed to a chemically bonded acrylate-functional silane. Printing plates providing impressions having excellent dot retention were obtained in those experiments where 1.0 and 2.0 parts of trimethylolpropane trimethacrylate were used. Where 4.0 and 8.0 parts of trimethylolpropane trimethacrylate were used, somewhat nonuniform coatings were obtained because the acrylate monomer is immiscible with the silicone solution.

EXAMPLE 5

A printing plate was prepared by overcoating a silicone coated aluminum plate prepared as described in Example 1 with a solution of:

| | |
|---|---|
| 5 parts | Gelva $C_5V_{16}$ (Tradename for a polyvinyl acetate resin) |
| 2.5 parts | Dimethylaminoethyl methacrylate |
| 3.8 parts | SR-295 (Tradename for an acrylate monomer) |
| 3 parts | SR-368 (Tradename for an acrylate monomer) |
| 0.04 part | MOST |
| 0.2 part | FC-2600 (Tradename for a fluorocarbon surfactant) |
| 38 parts | 95 percet by volume Ethanol in water. |
| 38 parts | 95 percent by volume Methylethyl |

-continued

| | |
|---|---|
| | ketone in water. |

After drying, the plate was exposed through a negative for 45 seconds in a medium pressure mercury arc exposure unit and developed with water. The plate was placed on a conventional printing press with an inactivated dampening system whereupon more than 2000 sharp impressions with excellent dot retention were obtained.

EXAMPLE 6

Printing plates were prepared as described in Example 1 by first coating the aluminum sheet with a solution of:

| | |
|---|---|
| 10 parts | Syloff 23 |
| 0.5 part | Dibutyltin dilaurate |
| 0.33 part | Dow Corning A297 |
| 8.3 parts | Methyl methacrylate | followed by drying and curing. The coating was overcoated with a solution of:

| | |
|---|---|
| 5.0 parts | Elvacite 2013 |
| 2.8 parts | TMP-TMA |
| 0.15 part | MOST |
| 0.1 part | FC-431 |
| 40 parts | Toluene |

After drying, the coated plate was exposed, developed, and placed on a press as described in Example 1 whereon sharp impressions having a clear background were obtained.

When equal amounts of ethyl methacrylate, butyl methacrylate, lauryl methacrylate, tetrahydrofurfuryl methacrylate or vinyl methacrylate were utilized in place of the methyl methacrylate, similar results were obtained.

EXAMPLE 7

Printing plates were prepared as described in Example 1 by first coating the aluminum sheet, using a No. 10 Meyer bar, with a solution of:

| | |
|---|---|
| 10 parts | SS4191 (Tradename for a heat curable silicone having hydrogen-containing and hydroxy-terminated structures.) |
| 5 parts | Union Carbide A174 |
| 0.4 part | SS4192C (Tradename for a silicone curing catalyst.) |
| 0.4 part | SS4193C (Tradename for a silicone curing catalyst.) |
| 35 parts | Xylene |

The coating was dried and cured by heating at 140° C. for 2 to 3 minutes and then overcoated using a No. 10 Meyer bar with a solution of:

| | |
|---|---|
| 10 parts | Elvacite 2013 |
| 4 parts | TMP-TMA |
| 0.3 part | MOST |
| 1.0 part | FC-431 |
| 30 parts | Xylene |

The plates were exposed to a microimage, developed and utilized in a press as described in Example 1, whereupon sharp impressions having clear backgrounds and resolution to about 57 lines/mm. were obtained.

In the above formulation, the amount of Union Carbide A174 could be varied from about 0.1 to 25 parts with plates obtained giving good impressions having clear backgrounds. Amounts of Union Carbide A174 between about 1.5 to 5 parts gave sharp impressions having excellent resolution and clear backgrounds.

EXAMPLE 8

Printing plates were prepared by coating 6 mil silicated aluminum sheeting with a knife coater operating at 6 ft. per minute with a solution of:

| | |
|---|---|
| 180 g. | Syloff 291 (Tradename for a mixture of a hydroxy-terminated polysiloxane having an average molecular weight of 20,000 and 5 to 10 percent of a hydrogen siloxane having an average molecular weight of about 1000) |
| 220 g. | A174 |
| 25 g. | Dibutyltin dilaurate, and |
| 1200 g. | Heptane | which had been mixed, heated to 85° C. during a 2-hour period, held at this temperature for 1 hour, allowed to cool and to which was then added 20 g. of Dow Corning A297. The coating was dried and cured by passing through an oven at 120° C. utilizing a residence time of 10 minutes. Coating weight obtained was 6.3 grams per square meter. The silicone-coated sheet was then knife coated with a solution of:

| | |
|---|---|
| 100 g. | Elvacite 2013 |
| 40 g. | TMP-TMA |
| 3.0 g. | MOST |
| 0.25 G. | Rhodamine B Base (a dye) |
| 10 g. | FC-431 |
| 600 g. | Xylene |

The coating was dried at 60° C. whereupon a dry coating weight of 15.9 grams per square meter of photopolymer was obtained. Plates prepared in this manner were exposed in a vacuum frame through a negative for 45 seconds under a medium pressure mercury arc exposure unit. Exposed plates were developed with a solution of 70 percent n-propanol, 20 percent ethyl cellosolve and 10 percent water by volume, dried, and were placed in a conventional printing press using driographic ink but having the dampening system inactivated. There were obtained 10,000 sharp impressions having a clear background.

EXAMPLE 9

A printing plate was prepared by coating a 5 mil cleaned aluminum sheet using a No. 6 Meyer bar with a solution of:

| | |
|---|---|
| 10 parts | Syloff 23 |
| 2 parts | A174 |
| 0.2 part | Dibutyltin dilaurate |
| 0.1 part | A297 |
| 0.05 part | fumed silica |
| 35 parts | Xylene |

A photopolymerizable coating was prepared by coating a 3 mil transparent polyester film with a solution of:

| parts | Elvacite 2013 |
| --- | --- |
| 1 part | TMP-TMA |
| 0.04 part | MOST |
| 0.12 part | FC-431 |
| 5 parts | Xylene |

The two coatings were dried, the silicone coating cured by heating at 90°–100° C. for 10 minutes and the two coatings laminated together in face-to-face intimate relationship using a pressure of about 10 inches of mercury per square centimeter. The assembly was then exposed through the polyester backing for 30 seconds to an image pattern using a medium pressure mercury arc exposure unit. The polyester film was then peeled from the assembly, whereupon the photopolymer coating in unexposed areas adhered to the polyester film and separated cleanly from the silicone layer. The so-produced plate accepted ink in the exposed areas but not in the unexposed areas and produced impressions on paper having a clear background.

What is claimed is:

1. An imaged planographic driographic printing plate comprising a substrate having coated on one surface thereof a highly abhesive layer comprising a cured organopolysiloxane elastomer which is capable of repelling oleo ink when dry and is characterized by an adhesive release value when dry of less than about 100 grams per inch, said abhesive layer containing therein polymerizable ethylenically-unsaturated groups, and having chemically bonded to said abhesive layer in image areas an oleo ink receptive polymeric layer, said polymeric layer being chemically bonded to said abhesive layer by photo-induced polymerization.

2. The printing plate of claim 1 wherein said abhesive layer further includes at least one polymerizable monomer containing ethylenically-unsaturated groups.

3. The printing plate of claim 2 wherein said organopolysiloxane elastomer has structural units of the formula:

wherein the R's are methyl, ethyl or phenyl, w is from about 100 to about 2500 and x and y are each from about 2 to about 15.

4. The printing plate of claim 1 wherein said organopolysiloxane elastomer has structural units of the formula:

wherein the R's are methyl, ethyl or phenyl; w is from about 100 to about 2500; x and y are each from about 2 to about 15; m is 0, 1 or 2; n is 1 to 4; and Y is hydrogen, methyl, halogen or phenyl.

5. A presensitized light-sensitive sheet construction comprising a substrate having coated on one surface thereof an abhesive layer comprising a cured organopolysiloxane elastomer which is capable of repelling oleo ink when dry and is characterized by an adhesive release value when dry of less than about 100 grams per inch, said abhesive layer containing therein polymerizable ethylenically-unsaturated groups, and lying over said abhesive layer and in intimate contact therewith a light-sensitive layer comprising an ethylenically-unsaturated free radical initiated photopolymerizable compound and an initiator therefor.

6. The sheet construction of claim 5 wherein said abhesive layer further includes at least one polymerizable monomer containing ethylenically unsaturated groups.

7. The sheet construction of claim 6 wherein said organopolysiloxane elastomer has structural units of the formula:

wherein the R's are methyl, ethyl or phenyl, w is from about 100 to about 2500 and x and y are each from about 2 to about 15.

8. The sheet construction of claim 5 wherein said organopolysiloxane elastomer has structural units of the formula:

wherein the R's are methyl, ethyl or phenyl; w is from about 100 to about 2500; x and y are each from about 2 to about 15; m is 0, 1 or 2; n is 1 to 4; and Y is hydrogen, methyl, halogen or phenyl.

9. The sheet construction of claim 5 further comprising a transparent substrate overlying said light-sensitive layer.

10. A process for preparing a driographic printing plate comprising:
   (a) coating a substrate with a layer of a curable composition comprising an organopolysiloxane which when cured is capable of repelling oleo ink when dry and is characterized by an adhesive release value when dry of less than about 100 grams per inch, said composition containing therein polymerizable ethylenically unsaturated groups;
   (b) curing said composition;
   (c) coating the cured composition with a light-sensitive composition comprising an ethylenically-unsaturated free radical initiated photopolymerizable compound and an initiator therefor;
   (d) exposing the coated substrate to actinic radiation in an imagewise manner; and
   (e) developing the imagewise exposed coated substrate whereby the unexposed portions of said light-sensitive composition are removed and the exposed portions thereof are polymerized and chemically bonded to the underlying cured composition.

11. The process of claim 10 wherein said organopolysiloxane, when cured, has structural units of the formula:

wherein the R's are methyl, ethyl or phenyl, w is from about 100 to about 2500 and x and y are each from about 2 to about 15.

12. The process of claim 10 wherein said organopolysiloxane, when cured, has structural units of the formula:

wherein the R's are methyl, ethyl or phenyl; w is from about 100 to about 2500; x and y are each from about 2 to about 15; m is 0, 1 or 2; n is 1 to 4; and Y is hydrogen, methyl, halogen or phenyl.

UNITED STATES PATENT AND TRADEMARK OFFICE
CERTIFICATE OF CORRECTION

PATENT NO. : 4,225,663
DATED : September 30, 1980
INVENTOR(S) : Alan Ball

It is certified that error appears in the above-identified patent and that said Letters Patent are hereby corrected as shown below:

In column 2, line 2, for "Te" read --The--.

In column 5, Formula V, line 48, delete "[m-1]" located on the bottom right of the formula.

In column 7, line 46, for "group" read --groups--.

In column 10, line 68, for "percet" read --percent--.

In column 13, line 1, for "parts" read --5 parts--.

In column 14, claim 4, line 14, delete "[m-1]" located on the bottom right of the formula.

In column 14, claim 8, line 67, delete "[m-1]" located on the bottom right of the formula.

In column 16, claim 12, line 30, delete "[m-1]" located on the bottom right of the formula.

Signed and Sealed this

Twentieth Day of January 1981

[SEAL]

Attest:

RENE D. TEGTMEYER

Attesting Officer     Acting Commissioner of Patents and Trademarks